(12) United States Patent
Forrest et al.

(10) Patent No.: US 8,633,497 B2
(45) Date of Patent: Jan. 21, 2014

(54) CONCAVE-HEMISPHERE-PATTERNED ORGANIC TOP-LIGHT EMITTING DEVICE

(75) Inventors: Stephen R. Forrest, Ann Arbor, MI (US); Michael Slootsky, Ann Arbor, MI (US); Richard Lunt, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 77 days.

(21) Appl. No.: 12/731,249

(22) Filed: Mar. 25, 2010

(65) Prior Publication Data

US 2010/0258821 A1    Oct. 14, 2010

Related U.S. Application Data

(60) Provisional application No. 61/211,003, filed on Mar. 25, 2009.

(51) Int. Cl.
*H01L 51/52* (2006.01)

(52) U.S. Cl.
USPC .................................. 257/88; 257/E51.019

(58) Field of Classification Search
USPC ........................................ 257/88, E51.019
See application file for complete search history.

(56) References Cited

U.S. PATENT DOCUMENTS

| 4,769,292 | A | 9/1988 | Tang et al. |
| 5,703,436 | A | 12/1997 | Forrest et al. |
| 5,707,745 | A | 1/1998 | Forrest et al. |
| 5,844,363 | A | 12/1998 | Gu et al. |
| 6,097,147 | A | 8/2000 | Baldo et al. |
| 6,303,238 | B1 | 10/2001 | Thompson et al. |
| 7,279,704 | B2 | 10/2007 | Walters et al. |
| 2003/0164679 | A1* | 9/2003 | Hamano et al. ............... 313/504 |
| 2003/0230980 | A1 | 12/2003 | Forrest et al. |
| 2004/0174116 | A1 | 9/2004 | Lu et al. |
| 2009/0066241 | A1 | 3/2009 | Yokoyama |
| 2009/0152533 | A1* | 6/2009 | Chan et al. ....................... 257/40 |

FOREIGN PATENT DOCUMENTS

| EP | 1427034 | 6/2004 |
| EP | 1478034 | 11/2004 |

OTHER PUBLICATIONS

International Search Report and Written Opinion in PCT/2010/028672.
Baldo et al., "Highly Efficient Phosphorescent Emission from Organic Electroluminescent Devices," Nature, vol. 395, 151-154, 1998.

(Continued)

*Primary Examiner* — Matthew W Such
*Assistant Examiner* — Monica D Harrison
(74) *Attorney, Agent, or Firm* — Morgan, Lewis & Bockius LLP

(57) ABSTRACT

A first device is provided. The first device includes an organic light emitting device, which further comprises a first electrode, a second electrode, and an organic emissive layer disposed between the first and second electrode. Preferably, the second electrode is more transparent than the first electrode. The organic emissive layer has a first portion shaped to form an indentation in the direction of the first electrode, and a second portion shaped to form a protrusion in the direction of the second electrode. The first device may include a plurality of organic light emitting devices. The indentation may have a shape that is formed from a partial sphere, a partial cylinder, a pyramid, or a pyramid with a mesa, among others. The protrusions may be formed between adjoining indentations or between an indentation and a surface parallel to the substrate.

22 Claims, 9 Drawing Sheets

(56) References Cited

OTHER PUBLICATIONS

Baldo et al., "Very high-efficiency green organic light-emitting devices based on electrophosephorescence,"Appl. Phys. Lett., vol. 75, No. 3, 4-6 (1999).

Ishihara Kuniaki et al., "Light-emitting diodes with photonic crystals on glass substrate fabricated by nanoimprint lithography" Applied Physics Letters, American Institute of Physics, Melville, NY, 2007, vol. 90, No. 11, pp. 111114-111114.

Geyer Ulf et al., "Large-scale patterning of indium tin oxide electrodes for guided mode extraction from organic light-emitting diodes" Journal of Applied Physics, American Institute of Physics. New York, US, vol. 104, No. 9, Nov. 12, 2008, pp. 93111-93111.

G. Z. Ran et al., "Role of the dielectric capping layer in enhancement of light outcoupling for semitransparent metal-cathode organic light-emitting devices," Journal of Optics A: Pure and Applied Optics, vol. 8, 2006, pp. 733-736.

\* cited by examiner

CONCAVE-HEMISPHERE-PATTERNED ORGANIC TOP-LIGHT EMITTING DEVICE

This application claims priority to U.S. application Ser. No. 61/211,003, filed Mar. 25, 2009.

This invention was made with government support under Grant No. DE-FG02-08ER85082 awarded by the Department of Energy. The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light emitting devices. More specifically, the present invention relates to organic light emitting diodes.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

More details on OLEDs, and the definitions described above, can be found in U.S. Pat. No. 7,279,704, which is incorporated herein by reference in its entirety.

SUMMARY OF THE INVENTION

A first device is provided. The first device includes an organic light emitting device, which further comprises a first electrode, a second electrode, and an organic emissive layer disposed between the first and second electrode. Preferably, the second electrode is more transparent than the first electrode. The organic emissive layer has a first portion shaped to form an indentation in the direction of the first electrode, and a second portion shaped to form a protrusion in the direction of the second electrode. The indentation may be concave. The first device may include a plurality of organic light emitting devices.

The organic light emitting device may be disposed over a substrate, such that the first electrode is disposed over the substrate, and the second electrode is disposed over the first electrode. The second electrode may be an anode and is preferably conformal to the organic emissive layer. The first electrode may be a cathode and is preferably reflective.

Preferably, the distance between the first and second electrodes has an optical path length of about one half of the peak wavelength of light emitted by the organic emissive layer.

The device may further comprise an outcoupling enhancement layer disposed over the second electrode.

The first device may have protrusion that are formed at a boundary between two adjoining indentations.

The first device may also have protrusions that are formed at a boundary between an indentation and a surface parallel to the substrate.

The organic emissive layer may have a shape that includes a plurality of indentations in the direction of the first electrode. The indentation may be shaped to form a partial sphere. Preferably, the partial sphere has a radius of curvature between 1 µm and 1 cm. The indentation may also be shaped to form a partial cylinder. The indentation may also be shaped form a rotationally symmetric aspheric surface. Preferably, the rotationally symmetric aspheric surface has a radius of curvature that is between 1 µm and 1 cm at all points on the surface. The indentation may also be shaped to form an inverted pyramid with or without a mesa. Preferably, every point on the surface of the indentation is within 10 attenuation lengths of an edge of the indentation, measured by traveling along the surface of the indentation.

Preferably, of the light emitted by the organic emissive layer, at least 5% is waveguide outcoupled and at least 20% is directly outcoupled, and more preferably, at least 25% is directly outcoupled.

The first device may be a consumer device.

The first device may further comprise an active matrix backplane.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
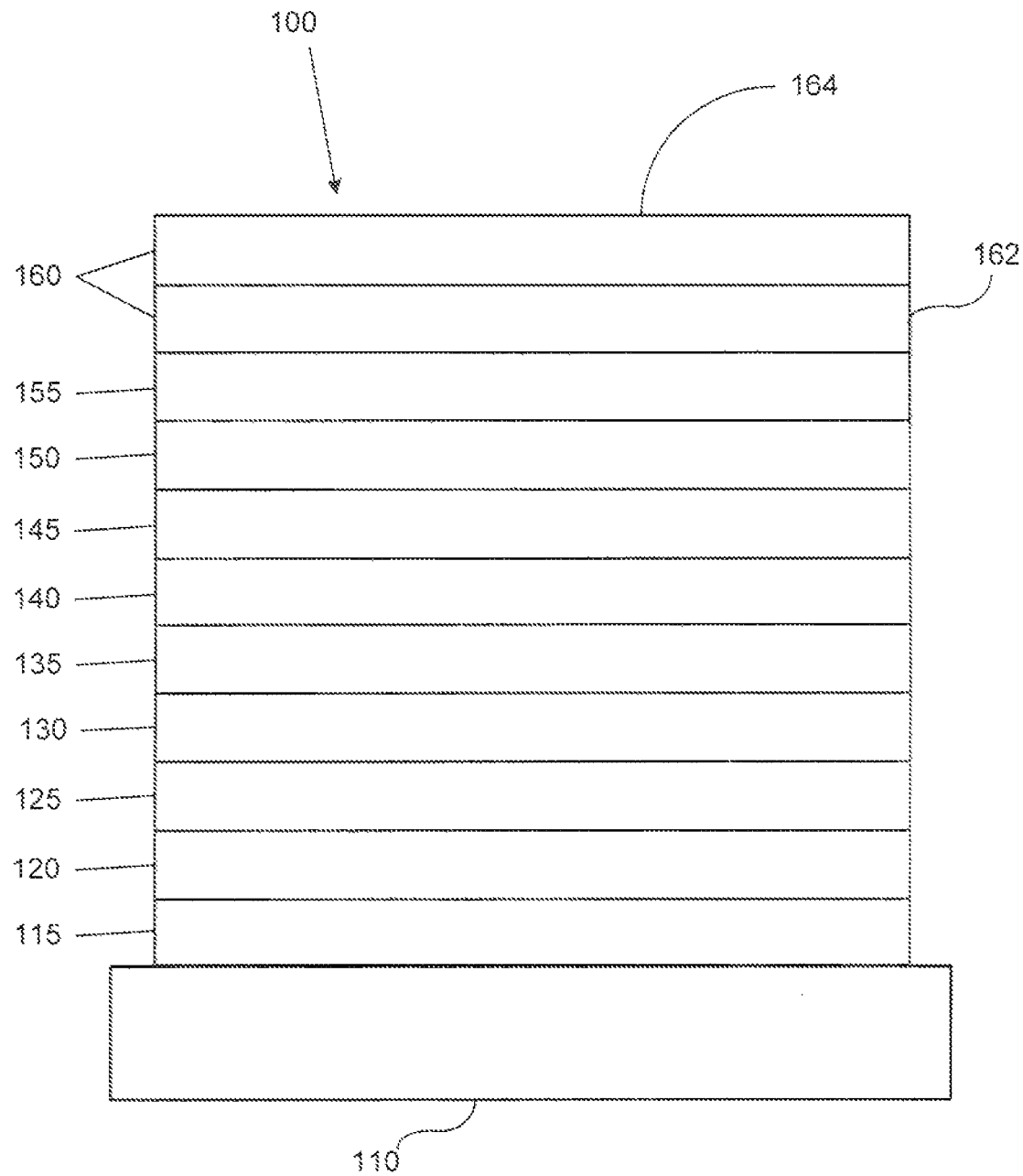
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

Figure 2:
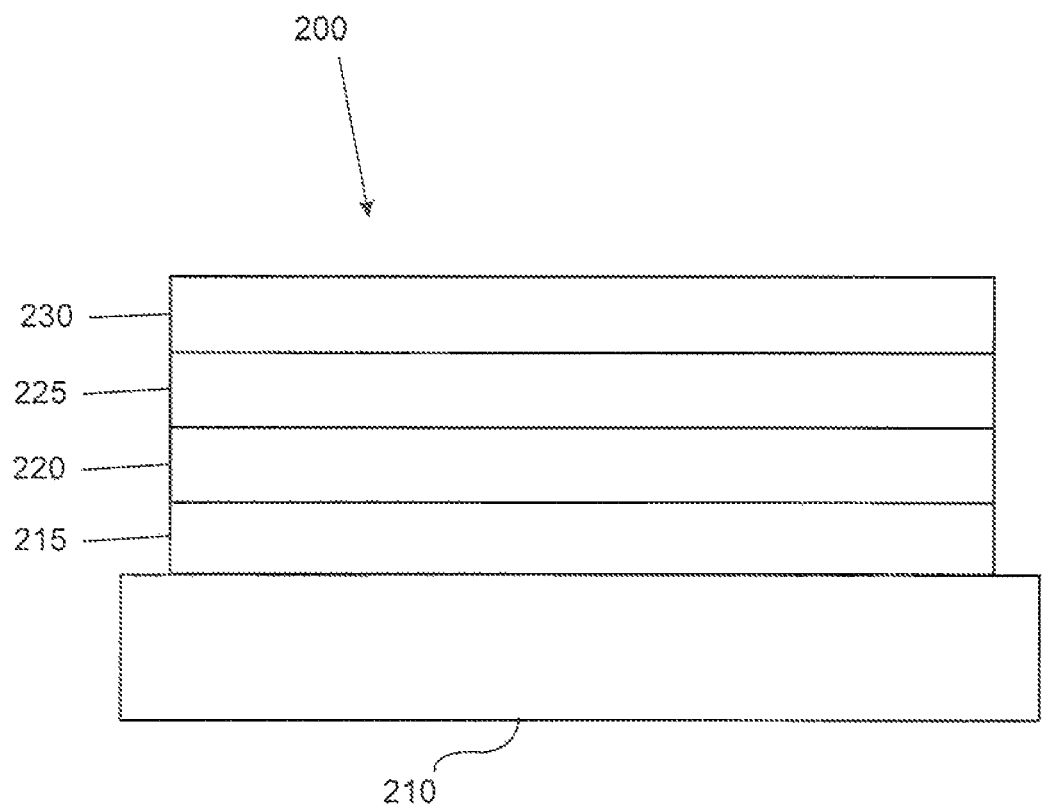
FIG. 2 shows an inverted organic light emitting device that does not have a separate electron transport layer.

FIG. 2 shows an inverted organic light emitting device 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The simple layered structure illustrated in FIGS. 1-2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. In one embodiment, an OLED may be described as having an "organic layer" disposed between a cathode and an anode. This organic layer may comprise a single layer, or may further comprise multiple layers of different organic materials as described, for example, with respect to FIGS. 1-2.

An efficient light emitting device that generates a large amount of illumination while consuming as little power as possible is particularly desirable. Outcoupling schemes for extracting light from thin-film organic light-emitting diodes (OLEDs) are an important route to increasing the power efficiency of these devices for a variety of uses, including white-light and display applications. An architecture has been developed consisting of a top-emitting (inverted) OLED deposited on a substrate patterned with micron-scale indentations to enhance the outcoupling of light from the high-index organic region. In a typical bottom-emitting OLED, nearly 50% of light is confined to the high-index region, ~30% is trapped in the substrate due to total internal reflection, and only ~20% of light generated by the organic layer is emitted from the device. By inverting the OLED structure (depositing the metal cathode first, followed by organic layers, and a transparent anode) substrate trapped modes are eliminated. Subsequently, the shape of the indentation(s) in the device allow(s) light to be "waveguided" in the high-index region to escape in the forward viewing direction via added reflections from the cathode and by edge-emission from the edges of the indentations. Simulations indicate that the proposed architecture increases the extraction efficiency to at least 50%. Additionally, this architecture increases the effective active area of the device and should provide a wider angular profile. Since the emission is not through the substrate as in bottom-emitting devices, the device allows the use of non-transparent materials such as plastics to reduce weight and cost, or integration with active-matrix backplanes for display applications. Lastly, an index-matching dielectric layer can be deposited on top of the transparent anode to further enhance light extraction. Enhancement by index-matching dielectric layers is disclosed in, for example, G. Z.

Ran et al., "Role of the dielectric capping layer in enhancement of light outcoupling for semitransparent metal-cathode organic light-emitting devices," *Journal of Optics A: Pure and Applied Optics*, vol. 8, 2006, pp. 733-736, which is incorporated by reference.

A first device is provided. The first device includes an organic light emitting device, which further comprises a first electrode, a second electrode, and an organic emissive layer disposed between the first and second electrode. Preferably, the second electrode is more transparent than the first electrode. The organic emissive layer has a first portion shaped to form an indentation in the direction of the first electrode, and a second portion shaped to form a protrusion in the direction of the second electrode.

Preferably, every point on the surface of the indentation is within 10 attenuation lengths of an edge of the indentation, measured by traveling along the surface of the indentation. This indentation size allows a significant amount of light generated in the organic emissive layer to reach an edge where waveguide outcoupling can occur. An organic light emitting device may extend over a plurality of indentations.

The "edge" of an indentation is in the protrusion, and is where edge outcoupling (e.g., waveguide outcoupling) occurs. The edge may be, for example, where an indentation meets a surface parallel to the substrate, or where an indentation meets an adjacent indentation. In FIGS. 3, 4, 5 and 6, an edge is located in regions 360, 460, 560, and 660, respectively. An edge in this context is not necessarily a sharp feature.

The phrase "attenuation length" means the propagation length after which the light intensity has decreased by a factor of $1/e \approx 1/2.718$. Since the intensity of a beam propagating along the waveguide direction goes as $I = I_0 e^{-\alpha \cdot z}$, the attenuation length is simply $z = 1/\alpha$, where $\alpha$ is the attenuation constant. The attenuation can occur both due to absorption and scattering from the waveguide ($\alpha = \alpha_{abs} + \alpha_{scatt}$). In the case of only absorption, $\alpha$ can be determined from the imaginary part of the waveguide propagation constant $\alpha = 2\text{Im}(\beta)$, $\beta = \sqrt{k^2 - k_x^2}$, where $k = 2\pi\tilde{n}/\lambda_0$, $k_x$ is determined by the waveguide phase-matching condition, $\lambda_0$ is the free-space wavelength and $\tilde{n} = n + i\kappa$ is the complex index of refraction with $\kappa$ being the extinction coefficient of the material. In the case of scattering and absorption, $\alpha = 2\text{Im}(\beta)$ also holds but the propagation constant $\beta$ now depends on the exact geometry and scattering effects in addition to the material absorption. The propagation (attenuation) constant is a commonly used metric in waveguide and optical fiber characterization; see for example Optical Society of America, Handbook of Optics, Volume IV, pp. 1.10-1.12, McGraw-Hill, which is incorporated herein by reference.

Figure 7:
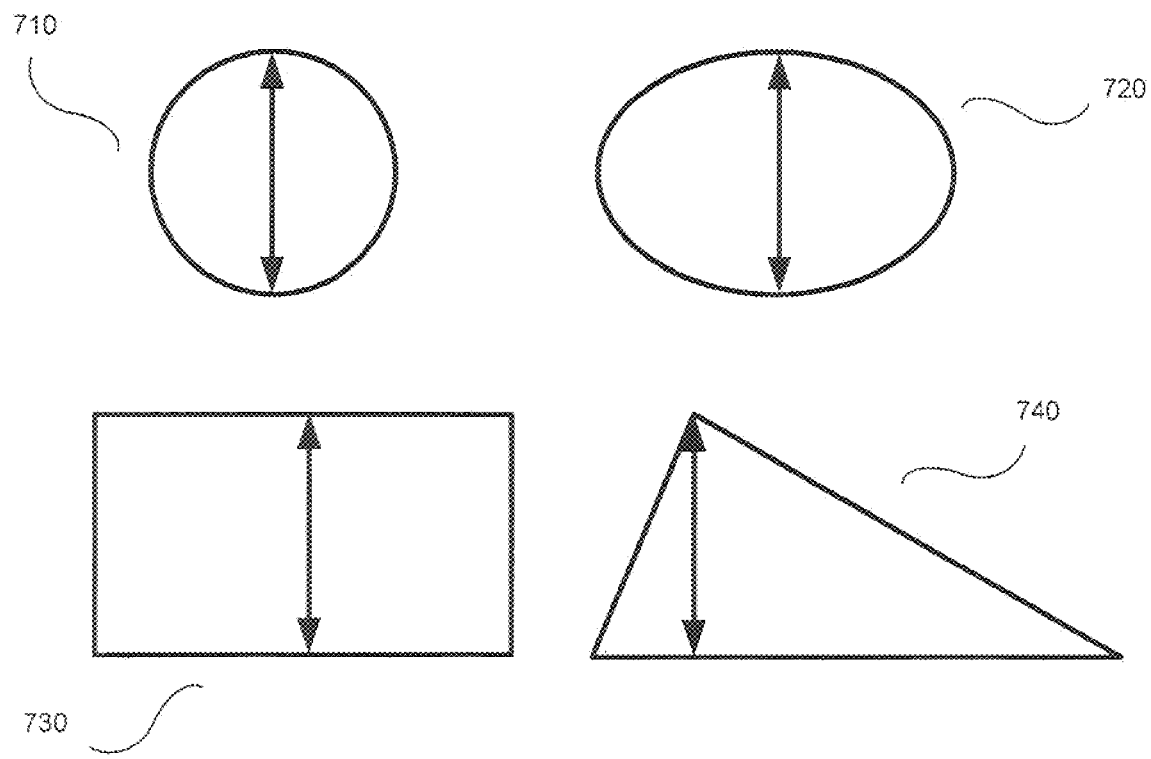
FIG. 7 shows top views of indentations with a variety of shapes.

FIG. 7 shows cross sections of four different indentation geometries. These shapes are exemplary and do not necessarily correspond to any particular layer architecture. The arrow in each indentation represents the "smallest dimension" of the indentation. In mathematical terms, at the smallest dimension, the arrow length is either at a local maximum (for the circle, oval and triangle) or is constant (for the rectangle) with respect to translation of the whole arrow in a direction perpendicular to the arrow, and the "smallest" dimension is the smallest local maximum or constant for which this occurs. FIG. 7 shows cross sections of indentations 710, 720, 730 and 740 having circular, oval, rectangular and triangular cross sections, respectively. These shapes are not meant to be limiting, and other shapes may be used.

The organic light emitting device may be disposed over a substrate, such that the first electrode is disposed over the substrate, and the second electrode is disposed over the first electrode. In a conventional bottom-emitting OLED the first electrode may be an anode and the second electrode may be a cathode.

The first electrode may be a cathode and is preferably reflective. The second electrode may be an anode and is preferably conformal to the organic emissive layer. This arrangement of electrodes corresponds to a top-emitting OLED.

Layers, electrodes, or similar features are "conformal" if they follow the physical shape of a layer, electrode, or similar feature disposed above or below them. For example, a cathode may be deposited on a substrate patterned with the indentations and protrusions illustrated in, for example, FIG. 3. The cathode layer will follow the shape of the substrate on which it is deposited, and will consequently also possess the indentation and protrusion features of the substrate. Likewise, additional layers deposited on the cathode, such as an organic layer, will also conform to the already deposited underlying surface features.

Devices having indentations described herein may be fabricated as follows. Indentations may be readily created in a substrate or a first electrode on a substrate, prior to deposition of organic material. Because organic materials are not present, and because many techniques are know for patterning common substrate and electrode materials, this may be readily accomplished.

For example, a first electrode may be plastically deformed with a stamp, or a first electrode may be etched with an isotopic etchant through a mask to form partial spheres, or a silicon substrate may be processed in any of a number of ways known in the art.

Subsequently deposited organic layers and second electrodes deposited by many known techniques will to a large degree form conformal layers over the underlying substrate and first electrode, leading to embodiments described herein.

Preferably, the first and second electrodes in a device are deposited such that the distance between the first and second electrodes results in an optical path length that produces a single-mode device, i.e. the distance between the first and second electrodes may be about half of the peak wavelength of light emitted by the emissive layer.

The device may further comprise an outcoupling enhancement layer disposed over the second electrode. The outcoupling enhancement layer may be an index-matching layer with a high index of refraction. Light transmittance is expected to increase with increasing indices of refraction of the index-matching layer.

Figure 3:
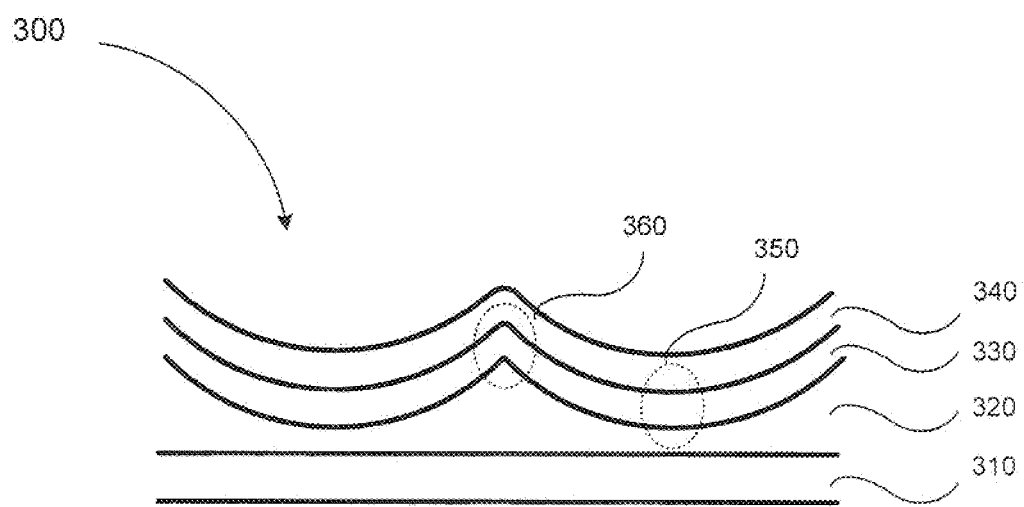
FIG. 3 shows an organic light emitting device with a concave shaped indentation and a protrusion formed by a boundary between adjoining indentations.
Figure 4:
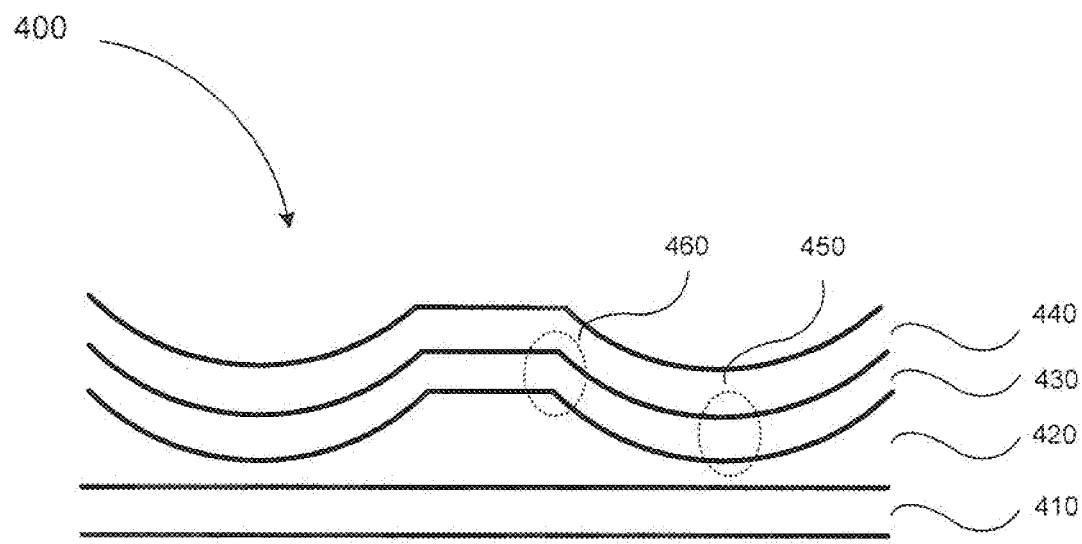
FIG. 4 shows an organic light emitting device with a concave shaped indentation and a protrusion formed by a boundary between an indentation and a surface parallel to the substrate.

The organic emissive layer may have a shape that includes a plurality of indentations in the direction of the first electrode. The indentation may be concave. A "concave" indentation is an indentation that has a curved shape. Illustrative concave indentations, without limitation, are shown in FIGS. 3-4. The indentation may be shaped to form a partial sphere. Preferably, the partial sphere has a radius of curvature between 1 μm and 1 cm. The indentation may also be shaped to form a partial cylinder. The indentation may also be shaped form a rotationally symmetric aspheric surface. Preferably, the rotationally symmetric aspheric surface has a radius of curvature that is between 1 μm and 1 cm at all points on the surface. The indentation may also be shaped to form an inverted pyramid with or without a mesa.

The first device may have protrusion that is formed at a boundary between two adjoining indentations or at a boundary between an indentation and a surface parallel to the substrate.

The indentation and protrusion features of the layer architecture of the present device, as shown in FIG. 3 for example, increase the amount of light extracted from the OLED. When light crosses a boundary between materials with different refractive indices, the light beam will be partially refracted at the boundary surface, and partially reflected. However, if the angle of incidence is greater (i.e. the ray is closer to being parallel to the boundary) than the critical angle—the angle of incidence at which light is refracted such that it travels along the boundary—then the light will stop crossing the boundary altogether and instead be totally reflected back internally. This effect is most relevant where light travels from a medium with a higher refractive index to one with a lower refractive index. For example, it will occur when passing from glass to air, but not when passing from air to glass.

The critical angle is the angle of incidence above which total internal reflection occurs. The angle of incidence is measured with respect to the normal at the refractive boundary. The critical angle $\theta_c$ is given by:

$$\theta_c = \arcsin\left(\frac{n_2}{n_1}\right),$$

where $n_2$ is the refractive index of the less optically dense medium, and $n_1$ is the refractive index of the more optically dense medium.

The application of these principles may be illustrated using FIG. 3. FIG. 3 shows an inverted organic light emitting device 300 with a concave shaped region 350 (the indentation) and a region 360 (protrusion formed by a boundary between adjoining indentations). The device includes a first electrode 340, an organic emissive layer 330, a second electrode 320, and a substrate 310. Device 300 may be fabricated by depositing the layers described, in order. Materials similar to those described with respect to device 100 may be used in the corresponding layers of device 300. Additional layers, for example, those described in FIG. 1, may also be deposited to comprise device 300. While the "organic emissive layer" is illustrated as a single layer, the device may include a variety of organic layers, some of which may not emit. Examples of such layers are provided in the discussion relating to FIGS. 1 and 2.

When waveguided light in organic emissive layer 330 passes through region 360, the emitted light will hit second electrode 320 at angles (θ) that become less and less parallel to the surface of the boundary for second electrode 320 (i.e. the condition θ<$\theta_c$ will be increasingly more likely to be satisfied), and consequently a larger portion of the light will be extracted from the device. This effect may be referred to as "waveguide outcoupling."

Figure 5:
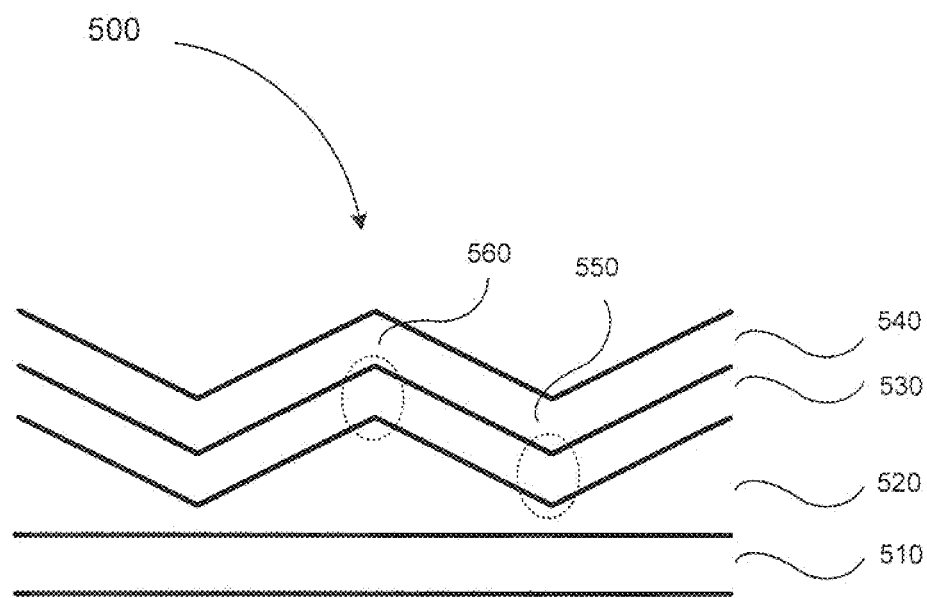
FIG. 5 shows an organic light emitting device with a pyramid shaped indentation and a protrusion formed by a boundary between adjoining indentations.
Figure 6:
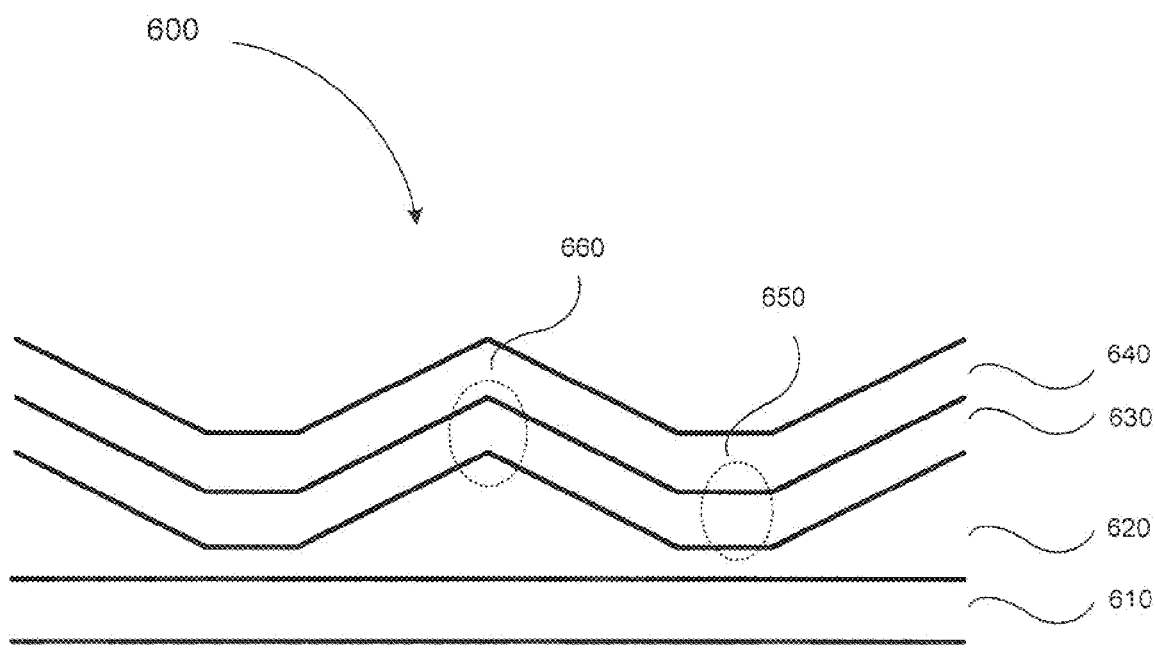
FIG. 6 shows an organic light emitting device with a pyramid-with-mesa shaped indentation and a protrusion formed by a boundary between adjoining indentations.

FIGS. 4-6 all contain indentation and protrusion regions that are analogous to those in FIG. 3, and would have similar effects on light incident to their respective boundaries. FIG. 4 is an example of an organic light emitting device with a concave indentation with a protrusion formed between an indentation and a surface parallel to the substrate. FIGS. 5 and 6 show examples of organic light emitting devices with pyramidal and pyramid-with-mesa shaped indentations and a protrusion formed by adjoining indentation, respectively. These geometries are for illustrative purposes and are not meant to limit the scope of acceptable layer architectures.

FIG. 4 shows an inverted organic light emitting device 400 with a concave shaped region 450 and a region 460 with a protrusion. The device includes a first electrode 440, an organic emissive layer 430, a second electrode 420, and a substrate 410. FIG. 4 differs from FIG. 3 in that the protrusion in region 460 is formed between an indentation and a surface parallel to the substrate.

FIG. 5 shows an inverted organic light emitting device 500 with a pyramidal shaped region 550 and a region 560 with a protrusion. The device includes a first electrode 540, an organic emissive layer 530, a second electrode 520, and a substrate 510. FIG. 5 differs from FIG. 3 in that the indentation in region 550 has a pyramidal shape.

FIG. 6 shows an inverted organic light emitting device 600 with a pyramid-with-mesa shaped region 650 and a region 660 with a protrusion. The device includes a first electrode 640, an organic emissive layer 630, a second electrode 620, and a substrate 610. FIG. 6 differs from FIG. 3 in that the indentation in region 650 has a pyramid-with-mesa shape.

TABLE 1

|  | Conventional OLED | Inverted OLED | OLED with protrusion R = 1 μm |
| --- | --- | --- | --- |
| Waveguide/cathode lost | ~55% | 72.2% | 48% |
| Substrate modes | ~25% | none | none |
| Waveguide outcoupled | none | none | 16% |
| Directly outcoupled to air | ~20% | 27.8% | 36% |
| Extraction Efficiency | ~20% | 27.8% | 52% |

Figure 8:
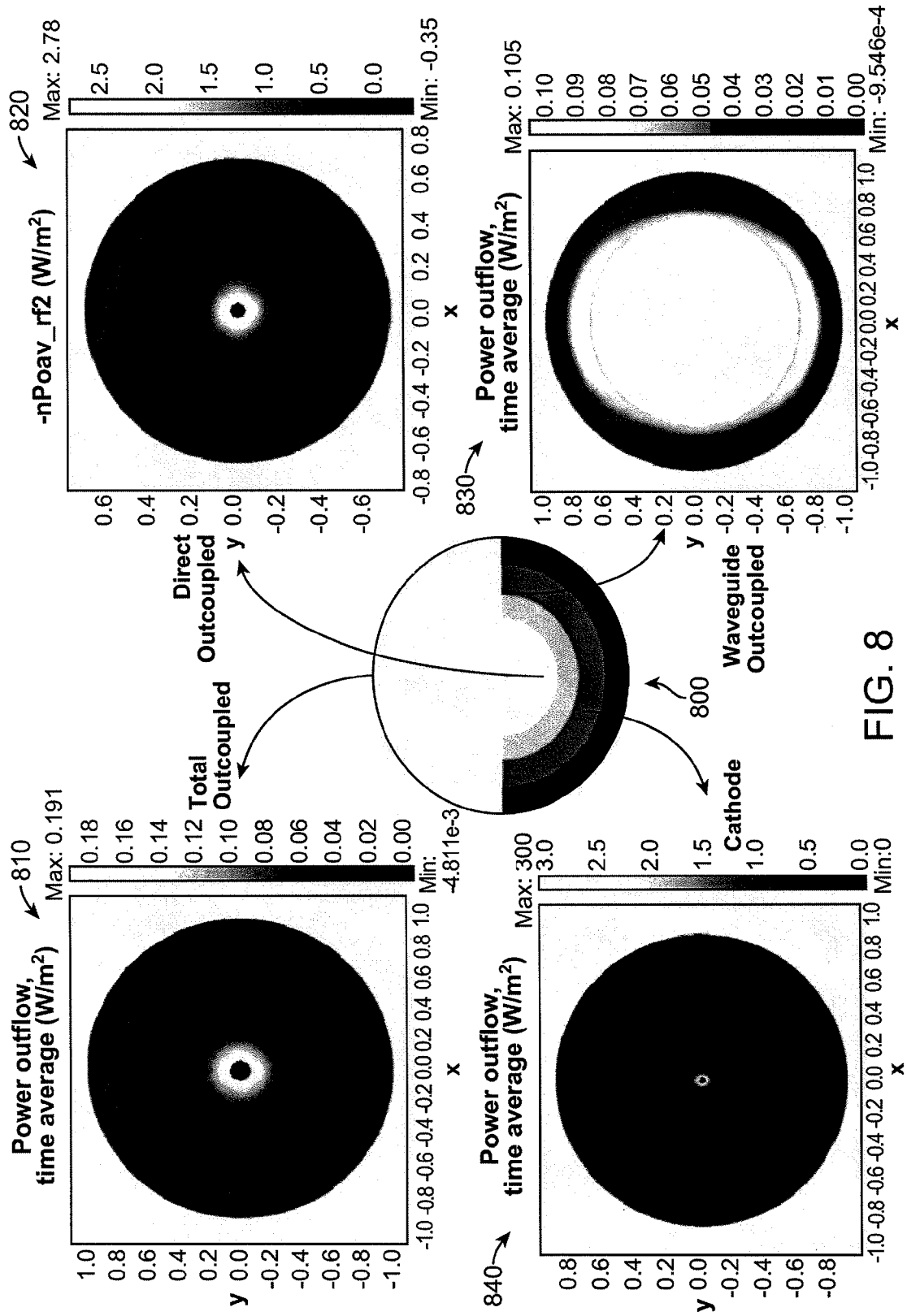
FIG. 8 shows simulation results for the horizontal dipole component of light extracted from a spherically shaped indentation.

Simulations were performed on a device 800 (FIG. 8) with a layer architecture and geometry similar to the device illustrated in FIG. 3. The x and y axes in each of the four plots in FIG. 8 measure the position along a spherically shaped indentation as viewed from above. FIG. 8 depicts the horizontal dipole component of extracted light using the gray scale to the right of each plot. Plots 810, 820, 830, and 840 depict intensities as a function of position for total outcoupled light, direct outcoupled light, waveguide outcoupled light, and cathode outcoupled light, respectively.

The curved geometry of device 800 causes waveguide modes in the emissive layer to outcouple. Device 800 as illustrated does not actually have a "protrusion" or a region analogous to region 360 in FIG. 3, but is rather a theoretical structure useful for estimating the magnitude of different modes of light that are applicable to device geometries illustrated herein. Similar results would be obtained using devices with indentations and protrusions illustrated in FIGS. 4-6, and with other kinds of indentation/protrusion combinations. Increased light extraction due to waveguide outcoupling may be readily seen as the bright ring along the edge of device 800 in plot 810.

Table 1 reports numerical values obtained from simulations on three types of OLEDs. Neither conventional (bottom emitting) OLEDs, nor inverted OLEDs lacking the indentations or protrusions of the present device had any waveguide outcoupled light, while a device such as device 800 had 16% extraction efficiency for waveguided light. Moreover a device such as device 800 also increases the amount of directly outcoupled light to air. The simulations show that a device such as device 800 would have at least 36% extraction efficiency, while conventional inverted OLEDs and bottom emitting OLEDs would have extraction efficiencies of 27.8% and ~20%, respectively.

Figure 9:
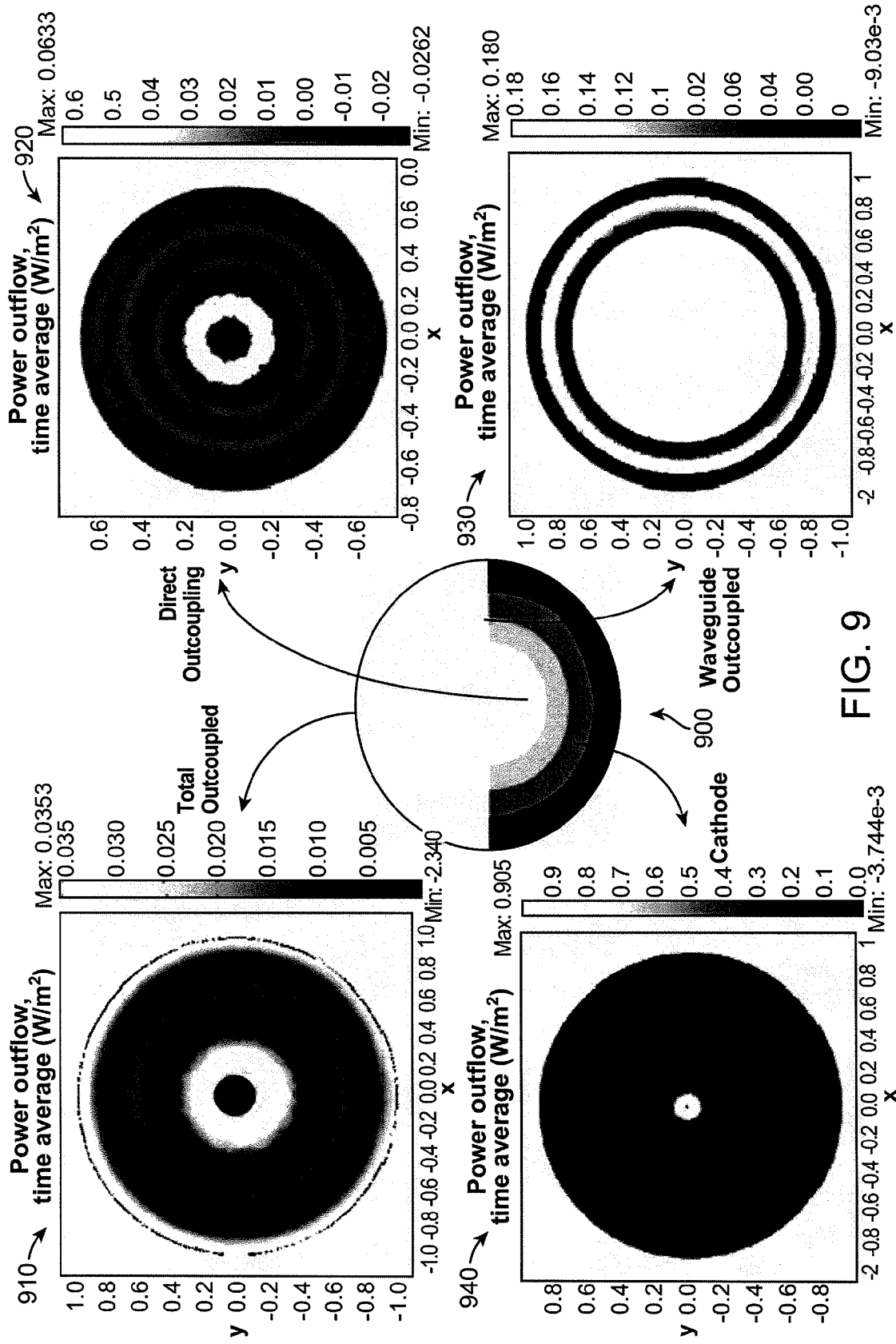
FIG. 9 shows simulation results for the vertical dipole component of light extracted from a spherically shaped indentation.

FIG. 9 shows the vertical dipole component of extracted light from device 900 corresponding to the simulation used to generate FIG. 8. Plots 910, 920, 930, and 940 depict intensities as a function of position for total outcoupled light, direct outcoupled light, waveguide outcoupled light, and cathode outcoupled light, respectively.

Of the light emitted by the organic emissive layer, at least 5% is waveguide outcoupled and at least 20% is directly outcoupled, and preferably, at least 25% is directly outcoupled. More preferably, of the light emitted by the organic emissive layer, at least 5% is waveguide outcoupled and at least 30% is directly outcoupled. These results are readily obtainable as illustrated in Table 1.

The first device may be a consumer device, which may include, without limitation, overhead lights, floor lights, etc.

The first device may further comprise an active matrix backplane, which may be incorporated into, for example, flat panel displays.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as devices used for general illumination purposes may incorporate the devices disclosed herein. Additionally, because of the efficiency of the combination of phosphoresce-based illumination and the outcoupling properties of the disclosed devices, these devices may be beneficial to the goal of reducing energy consumption in the United States and other countries.

The figures generally may not be drawn to scale.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A first device comprising an organic light emitting device, the organic light emitting device comprising:
    a first electrode;
    a second electrode;
    an organic emissive layer disposed between the first and second electrodes;
    wherein the second electrode is more transparent than the first electrode; and
    a first portion of the organic emissive layer has a shape that forms an indentation in the direction of the first electrode, wherein every point on the surface of the indentation is within 10 attenuation lengths of an edge of the indentation, measured by traveling along the surface of the indentation; and
    a second portion of the organic emissive layer has a shape that forms a protrusion in the direction of the second electrode,
    wherein, of the light emitted by the organic layer, at least 5% is waveguide outcoupled and at least 20% is directly outcoupled.

2. The first device of claim 1, wherein the indentation is concave in the direction of the first electrode.

3. The first device of claim 1, wherein:
    the organic light emitting device is disposed over a substrate;
    the first electrode is disposed over the substrate; and
    the second electrode is disposed over the first electrode.

4. The first device of claim 3, wherein the second electrode is an anode.

5. The first device of claim 4, wherein the first electrode is a cathode, and the first electrode is reflective.

6. The first device of claim 3, further comprising an outcoupling enhancement layer disposed over the second electrode.

7. The first device of claim 3, wherein the second electrode is conformal to the organic emissive layer.

8. The first device of claim 1, wherein the indentation forms a partial sphere.

9. The first device of claim 8, wherein the partial sphere has a radius of curvature between 1 μm and 1 cm.

10. The first device of claim 1, wherein the indentation forms a partial cylinder.

11. The first device of claim 10, wherein the rotationally symmetric aspheric surface has a radius of curvature that is between 1 μm and 1 cm at all points on the surface.

12. The first device of claim 1, wherein the indentation forms a rotationally symmetric aspheric surface.

13. The first device of claim 1, wherein the indentation forms an inverted pyramid not having a mesa.

14. The first device of claim 1, wherein the indentation forms an inverted pyramid having a mesa.

15. The first device of claim 1, wherein, of the light emitted by the organic layer, at least 5% is waveguide outcoupled and at least 25% is directly outcoupled.

16. The first device of claim 1, wherein the first device is a consumer device.

17. The first device of claim 1, wherein the first device further comprises an active matrix backplane.

18. The first device of claim 1, wherein the organic emissive layer has a shape that includes a plurality of indentations in the direction of the first electrode.

19. The first device of claim 1, wherein the first device includes a plurality of organic light emitting devices.

20. The first device of claim 1, wherein the distance between the first and second electrodes has an optical path length of about one half of the peak wavelength of light emitted by the organic emissive layer.

21. The first device of claim 1, wherein the protrusion is formed at a boundary between two adjoining indentations.

22. The first device of claim 1, wherein the protrusion is formed at a boundary between an indentation and a surface parallel to the substrate.

* * * * *